(12) United States Patent
Rafalowski et al.

(10) Patent No.: US 11,892,702 B2
(45) Date of Patent: Feb. 6, 2024

(54) OPTICAL DEVICE WITH HEATING ELEMENT

(71) Applicant: APTIV TECHNOLOGIES LIMITED, St. Michael (BB)

(72) Inventors: Arkadiusz Rafalowski, Brzezinka (PL); Miroslaw J. Zurowsk, Cracow (PL); Witold Poreda, Ruciane Nida (PL)

(73) Assignee: APTIV TECHNOLOGIES LIMITED, St. Michael (BB)

( * ) Notice: Subject to any disclaimer, the term of this patent is extended or adjusted under 35 U.S.C. 154(b) by 763 days.

(21) Appl. No.: 16/857,360

(22) Filed: Apr. 24, 2020

(65) Prior Publication Data

US 2020/0379206 A1    Dec. 3, 2020

(30) Foreign Application Priority Data

May 28, 2019  (EP) ..................................... 19176992

(51) Int. Cl.
  *G02B 7/02*  (2021.01)
  *H05B 3/06*  (2006.01)
  (Continued)

(52) U.S. Cl.
  CPC ............. *G02B 7/028* (2013.01); *H04N 23/55* (2023.01); *H05B 3/06* (2013.01); *H05B 3/84* (2013.01); *H05K 1/0212* (2013.01)

(58) Field of Classification Search
  CPC ........ F21S 45/60; F21V 31/005; G02B 7/028; H04N 5/2254; H04N 5/2251; H05B 3/06;
  (Continued)

(56) References Cited

U.S. PATENT DOCUMENTS

| 2011/0304762 A1 | 12/2011 | Chiu |
| 2012/0170119 A1 | 7/2012 | Chu et al. |

(Continued)

FOREIGN PATENT DOCUMENTS

| CN | 107690594 A | 2/2018 | |
| CN | 107771009 | * 3/2018 | ............... H05K 7/20 |

(Continued)

OTHER PUBLICATIONS

WO 2018/147696, Aug. 16, 2018, Choi et al, English Translation (Year: 2018).*

(Continued)

*Primary Examiner* — Peggy A Neils
(74) *Attorney, Agent, or Firm* — Harness, Dickey & Pierce, P.L.C.

(57) ABSTRACT

An optical device comprises a printed circuit board (PCB) comprising an image capture electronic circuit, a lens holder and a heating element. The lens holder extends along the optical axis of the optical device from its top to bottom extremities and comprises a top optical element arranged on its top extremity. The lens holder is mounted on the PCB so as to align, along the optical axis, the image capture electronic circuit and the top optical element. The heating element comprises a heating part arranged in contact with the top optical element and first and second electrical conductive wires. Each wire extends from the heating part to their bottom extremity which is directly attached in electrical contact with the PCB. The optical device also comprises first and second wire insertion guide elements. The first and second wires are respectively arranged in the first and second guide elements.

4 Claims, 4 Drawing Sheets

(51) Int. Cl.
    *H05B 3/84*         (2006.01)
    *H05K 1/02*         (2006.01)
    *H04N 23/55*       (2023.01)

(58) Field of Classification Search
    CPC .... H05B 3/84; H05B 2214/02; H05K 1/0212; G03B 17/55
    See application file for complete search history.

(56) References Cited

U.S. PATENT DOCUMENTS

| | | |
|---|---|---|
| 2018/0176431 A1 | 6/2018 | Kim et al. |
| 2018/0352120 A1 | 12/2018 | Rowski et al. |
| 2019/0100158 A1 | 4/2019 | Wato et al. |
| 2019/0137723 A1 | 5/2019 | Bernal et al. |

FOREIGN PATENT DOCUMENTS

| | | | | |
|---|---|---|---|---|
| CN | 108696678 A | | 10/2018 | |
| TW | 201806171 | * | 2/2018 | ........... H01L 27/146 |
| WO | WO 2018/147696 | * | 8/2018 | ............... B60R 1/12 |

OTHER PUBLICATIONS

CN 107771009, Mar. 6, 2018, Saito, English Translation (Year: 2018).*
TW 201806171, Balimann et al, Feb. 16, 2018—English Translation (Year: 2018).*
First Notification of Office Action for CN Application No. 202010223067.7 dated Jun. 1, 2021.
Extended European Search Report for Application No. EP 19 17 6992 dated Nov. 13, 2019.

* cited by examiner

OPTICAL DEVICE WITH HEATING ELEMENT

CROSS REFERENCE TO RELATED APPLICATION

This application claims priority to European Patent Application No. 19176992.6, filed on May 28, 2019.

TECHNICAL FIELD

The present disclosure relates to an optical device comprising a heating element for de-frosting and de-fogging the optical element of the device.

BACKGROUND

An optical device such as a camera mounted inside and outside of a vehicle requires a lens de-frosting and de-fogging system. A known solution is provided by an external heating element located in front of the top optical element such as a lens or a glass element of the lens. The disadvantage of the existing solutions is the increase of the size of the camera system and the difficulty to make a reliable electrical connection between the heating element and the camera system and to have a fast assembly process.

It is therefore important to propose a new solution to solve this problem.

SUMMARY

The present disclosure provides an optical device comprising a printed circuit board. The printed circuit board comprises an image capture electronic circuit and a lens holder extending along the optical axis of the optical device from its top extremity to its bottom extremity. The lens holder comprises a top optical element arranged on the top extremity of the lens holder. The lens holder is mounted on the printed circuit board so as to align, along the optical axis of the optical device, the image capture electronic circuit and the top optical element. The printed circuit board further comprises a heating element comprising a heating part arranged in contact with the top optical element and comprising a first electrical conductive wire and a second electrical conductive wire. Each electrical conductive wire extends from the heating part to its bottom extremity. The bottom extremity of each electrical conductive wire is directly attached in electrical contact with the printed circuit board. The optical device further comprises a first wire insertion guide element and in a second wire insertion guide element. The first electrical conductive wire and the second electrical conductive wire are respectively arranged in the first wire insertion guide element and in the second wire insertion guide element.

Each bottom extremity of each electrical conductive wire may comprise a rigid end. The printed circuit board may comprise two pass through hole from its top layer to its bottom layer. Each rigid end may be welded onto the bottom layer of the printed circuit board. The lens holder may comprise a cylindrical wall extending along the optical axis of the optical device from its top extremity to its bottom extremity and each wire insertion guide may comprise an open cavity extending through the cylindrical wall of the lens holder from an open top extremity of the cylindrical wall to an open bottom extremity of the cylindrical wall. Each open bottom extremity of each open cavity may be bearing against the printed circuit board and directly facing one pass through hole of the printed circuit board.

The present disclosure also provides an assembly method of the optical device described above comprising the steps of fixing the lens holder onto the printed circuit board comprising the image capture electronic circuit using a long drying time glue, inserting the first electrical conductive wire and the second electrical conductive wire of the heating element respectively into the first wire insertion guide element and into the second wire insertion guide element, arranging the heating part of the heating element on the top extremity of the lens holder, arranging the top optical element on the top extremity of the lens holder and in contact with the heating part of the heating element; aligning the image capture electronic circuit together with the top optical element according to the optical axis while glue is not dry, and fixing the bottom extremity of each electrical conductive wire to in electrical contact with the printed circuit board while glue is not dry.

The method may further comprise a step of preassembling of the top optical element together with the heater part of the heating element before being arranged on the top extremity of the lens holder.

The method may further comprise the steps of providing each electrical conductive wire of the heating element with rigid bottom electrical conductive extremity, and inserting the rigid bottom electrical conductive extremity of the first electrical conductive wire and the rigid bottom electrical conductive extremity of the second electrical conductive wire of the heating element respectively through a first pass through hole of the printed circuit board and through a second pass through hole of the printed circuit board.

BRIEF DESCRIPTION OF THE DRAWINGS

Other features, objects and advantages of the present disclosure will become apparent from reading the detailed description that follows, and the attached drawing, given by way of example and in which.

DETAILED DESCRIPTION

Figure 1:
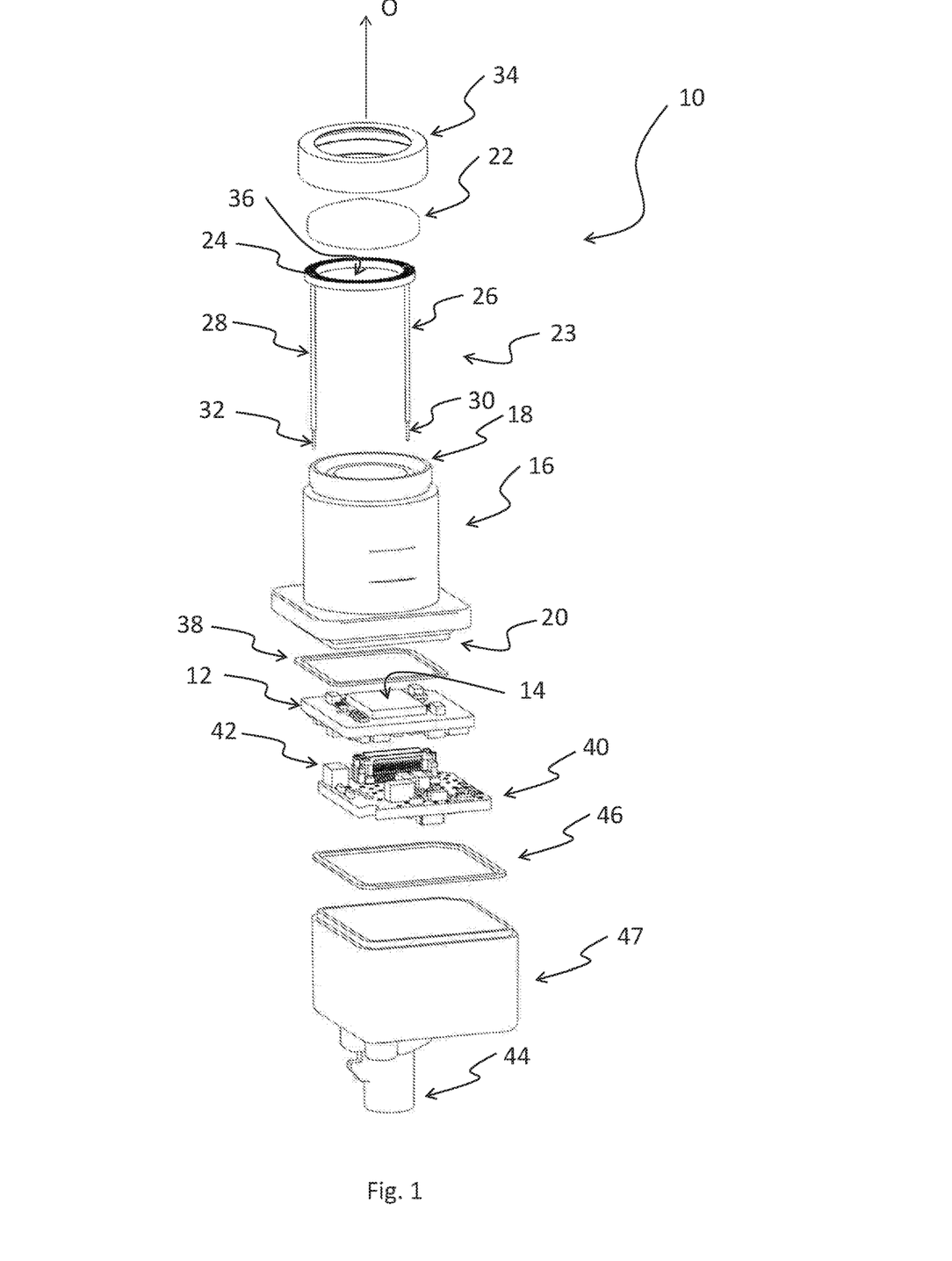
FIG. 1 is an exploded schematic perspective view of the optical device according to an example embodiment of the present disclosure.

According to the example of FIG. 1, an optical device 10 or a camera for a vehicle, configured to be mounted outside the vehicle, comprises a first printed circuit board 12 (PCB) equipped with an image capture electronic circuit 14 or imager integrated circuit, e.g., an imaging device of the camera. The optical device 10 further comprises a lens holder 16 extending from its top extremity 18 to its bottom extremity 20 along the optical axis O of the optical device 10. The terms "top" and "bottom" are used herein relative to the relative positions of the lens holder and the printed circuit board, as depicted in the drawings. The bottom extremity 20 of the lens holder 16 is configured to be arranged on the first printed circuit board 12. The lens holder 16 comprises at least one optical lens configured to be arranged on the top extremity 18 of the lens holder 16 or a transparent protection glass configured to be arranged on top extremity 18 of the lens holder 16 in order to protect optical lenses against dust or water or anything that may obstruct the optical lens. In general terms, the lens holder 16 comprises a top optical element 22 configured to be arranged on the top extremity 18 of the lens holder 16.

For de-frosting or de-fogging purposes, the optical device 10 comprises a heating element 23. The heating element 23 comprises a heating part 24 and two electrical conductive wires 26, 28 extending from the heating part 24 to their bottom extremity 30, 32, each bottom extremity 30, 32 of the two electrical conductive wires 26, 28 are configured to be arranged in electrical contact with the first printed circuit board 12.

The heating part 24 of the heating element 23 is configured to be arranged in contact with the top optical element 22 such that, when generating heat, said heating part 24 is configured to defrost of defog the top optical element 22. In some embodiments, the heating 24 part is directly in contact with the top optical element 22 of the optical device 10.

According to the example embodiment of FIG. 1, the heating part 24 of the heating element 23 is a annular ring arranged on the top extremity 18 of the lens holder 16, between the top optical element 22 and the top extremity 18 of the lens holder 16. More particularly, the annular ring is configured to be placed under the external periphery of a circular top optical lens.

According to the example of FIG. 1, the optical device 10 comprises a retainer element 34 configured to maintained the top optical element 22 fixed on the top extremity 18 of the lens holder 16. Other options for maintaining the top optical element 22 are possible such as adhesive tape or glue, or mechanical clips arranged from the lens holder 16.

To form an hermitical chamber between the top layer of the first printed circuit board 12 wherein the image capture electronic circuit 14 is arranged and the internal cavity 36 of the lens holder 16 wherein lenses may be arranged, the bottom extremity 20 of the lens holder 16 is fixed to the top layer of the first printed circuit board 12 by means of adhesive seal 38 such as a seal made of a glue. The glue is a glue or adhesive that does not dry substantially immediately such that the active alignment of the image capture electronic circuit 14 together with the optical lenses according to the optical axis O of the optical device 10 is proceeded or allowed while the glue is in its drying process. The glue is generally a type of a long drying time glue.

According to the example of FIG. 1, the optical device 10 comprises a second printed circuit board 40 configured to be in electrical contact with the first printed circuit board 12. The second printed circuit board 40 comprises a plurality of electronic components 42 such as, as non-limited examples, a controller configured to process images captured by the image capture electronic circuit 14, current source generator to provide electrical current through the heating element 23 when generating heat is necessary for defrost or defog purpose and also communication bus device interface configured to interconnect the optical device 10 with advanced driver assistance systems (ADAS) of the vehicle.

To enclose the first printed circuit board 12 and second printed circuit board 40 within the optical device 10, the optical device 10 comprises a bottom housing 47 comprising a connector 44 configured to provide electrical terminals for providing power supply to the second printed circuit board and access to the communication bus of the advanced driver assistance systems of the vehicle. The bottom housing 47 is sealed to the bottom extremity of the lens holder 16 by means of another adhesive seal 46.

Figure 2:
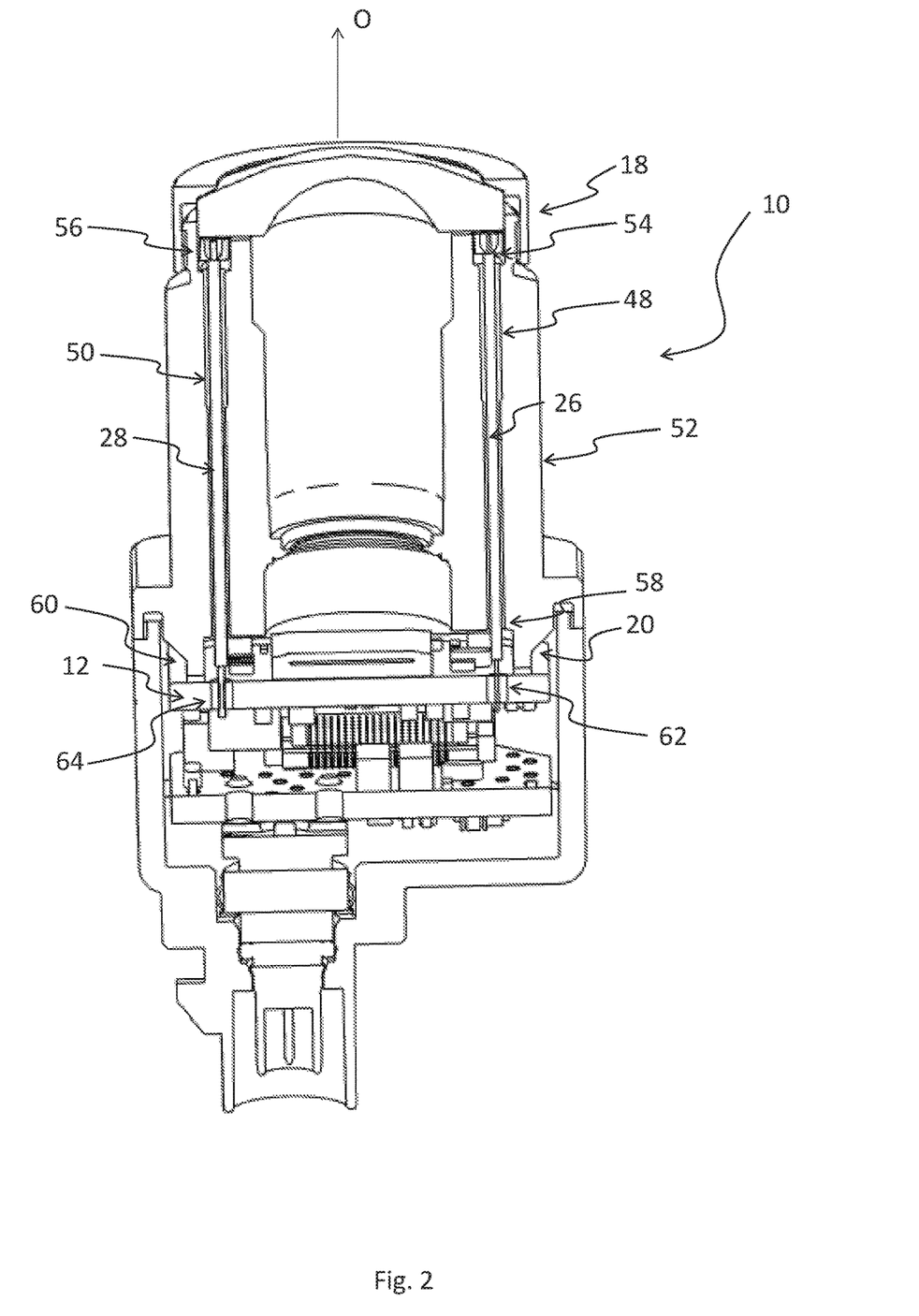
FIG. 2 is an axial cut schematic view of the optical device of FIG. 1.

According to the axial cut schematic of the optical device along its optical axis O shown in FIG. 2, the optical device 10 comprises a first wire insertion guide element 48 and a second wire insertion guide element 50, the first electrical conductive wire 26 and the second electrical conductive wire 28 being respectively arranged in the first wire insertion guide element 48 and in the second wire insertion guide element 50.

More particularly, each wire insertion guide 48, 50 is an open cavity of the cylindrical wall 52 of the lens holder 16, said cylindrical wall 52 extending along the optical axis O of the optical device 10 from its top extremity 18 to its bottom extremity 20. The first wire insertion guide element 48 and the second wire insertion guide element 50 are both an open cavity extending through the cylindrical wall 52 of the lens holder 16 from an open top extremity 54, 46 of the cylindrical wall 52 to an open bottom extremity 58, 60 of the cylindrical wall.

For providing electrical contact between the first electrical conductive wire 26 and the second electrical conductive wire 28 with the first printed circuit board 12, the first printed circuit board 12 comprises two pass through holes 62, 64 from its top layer to its bottom layer such that each bottom extremity 30, 32 of the two electrical conductive wires 26, 28 are respectively arranged within the first pass through hole 62 and the second pass through hole 64, and welded in electrical contact with the first printed circuit board 12 from the bottom layer of the first printed circuit board 12.

In some embodiments, each bottom extremity 30, 32 of each electrical conductive wire 26, 28 comprises an electrical conductive rigid end with a diameter lower than each pass through hole 62, 64 of the first printed circuit board 12 such that they are inserted through the first printed circuit board 12 without any need of extra force, such that the optical alignment operation of the image capture electronic circuit 14 and the optical lenses of the optical device 10 with the optical axis O is not influenced by the assembly operation of the heating element 23 with the optical device 10.

Figure 3:
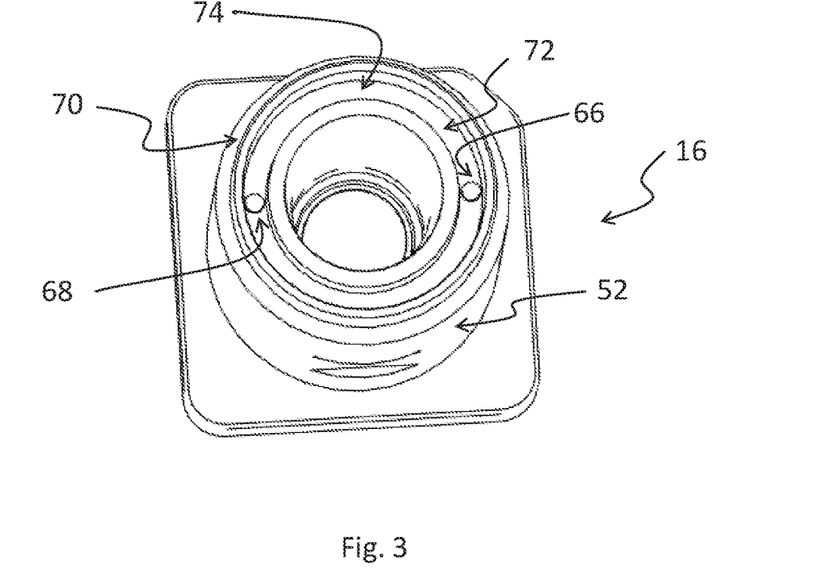
FIG. 3 is a schematic perspective top view of the lens holder of the optical device of FIG. 1.

According to FIG. 3, each open cavity comprises an inlet 66, 68 of the open cavity arranged on the top surface of the cylindrical wall 52 of the lens holder 16. In the illustrated embodiment, the two inlets 66, 68 are diametrically opposed such that, when inserted, providing good stability of the heating element 23. According to the embodiment of FIG. 3, the top surface of the cylindrical wall 52 of the lens holder 16 comprising the two inlets 66, 68 of the two open cavities is a circular shape. The top surface of the cylindrical wall 52 of the lens holder 16 is cylindrically delimited by an outer cylindrical vertical wall 70 and an inner cylindrical vertical wall 72 forming the heating element arrangement place 74.

Figure 4:
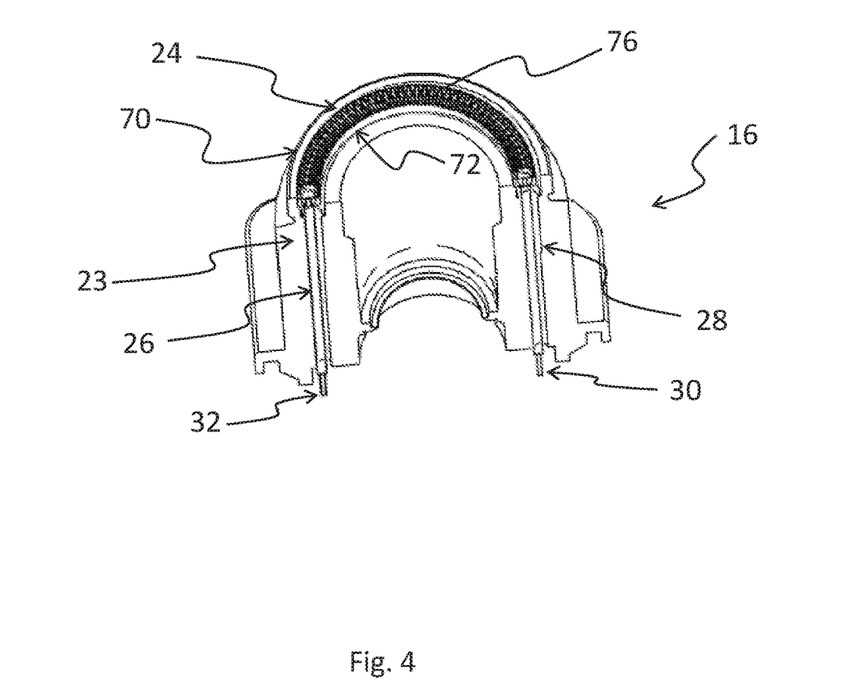
FIG. 4 is an axial cut schematic view of the lens holder of the optical device of FIG. 1 arranged with the heating element according to an example embodiment of the present disclosure.

According to the example of FIG. 4, the heating part 24 of the heating element 23 is a ring shape element comprising a conductive element 76 configured to provide heat when an electrical current is flowing within the conductive element. The conductive element 76, as a non-limited example, may be a metallic helicoidally spring or copper track of a printed circuit board comprising a circular shape.

The heating part 24 of the heating element 23 is arranged in the circular heating element arrangement place 74 in between the outer cylindrical vertical wall 70 and the inner cylindrical vertical wall 72.

According to the example of FIG. 4, the two electrical conductive wires 26, 28 are arranged within their respective open cavity. The two electrical conductive wires 26, 28 comprising an electrical insulated layer such that they are not in electrical contact with the cavities of the lens holder 16 that may be made of any metallic material.

Each conductive rigid end of the two electrical conductive wires 26, 28 are arranged outside the outlets of each open cavity such that they are configured to pass through the two pass through holes 62, 64 of the first printed circuit board 12.

Figure 5:
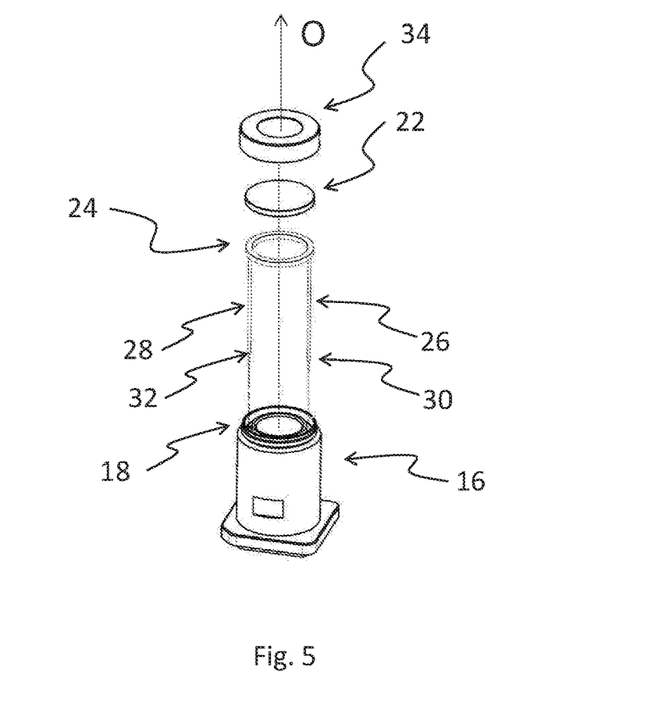
FIG. 5 is a schematic view of an assembly method of the optical device according to an example embodiment of the present disclosure.

According to FIG. 5, an example embodiment of an assembly method of the optical device 10 of the present disclosure comprises the lens holder 16 fixed onto the first printed circuit board by means of a long drying time glue. The first electrical conductive wire 26 and the second electrical conductive wire 28 of the heating element 23 are configured to be respectively inserted into the first wire insertion guide element 48 and into the second wire insertion guide element 50 such that the heating part 24 of the heating element 23 will be arranged on the top extremity 18 of the lens holder 16. To guaranteed defrosting or defogging of the top optical element 22, said top optical element 22 is configured to be arranged on the top extremity 18 of the lens holder 16 and in contact with the heating part 24 of the heating element 23. As an option, the lens retainer 34 is then placed on top of the top optical element 22. For a fast assembly, and as the electrical contact between the rigid ends of the two electrical conductive wires 26, 28 does not provide force's constraint on the first printed circuit board 12, the alignment of the image capture electronic circuit 14 together with the top optical element 22 according to the optical axis O is proceeded while glue is not dry and the bottom extremity 30, 32 of each electrical conductive wire 26, 28 may be welded in electrical contact with the first printed circuit board 12 while the glue is not dry.

Figure 6:
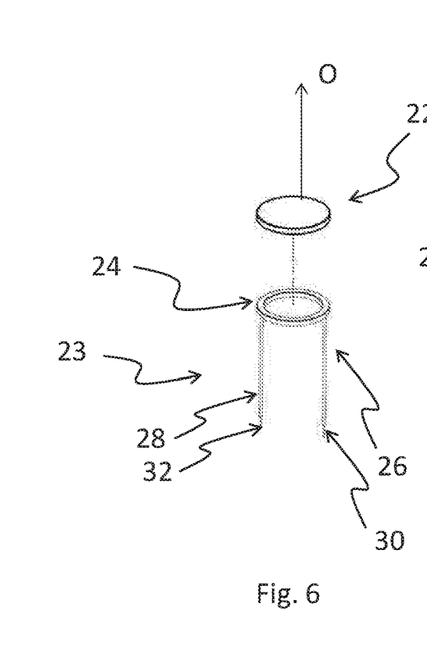
FIG. 6 is a schematic view of a preassembly method of a top optical element with the heating element according to an example embodiment of the present disclosure.
Figure 7:
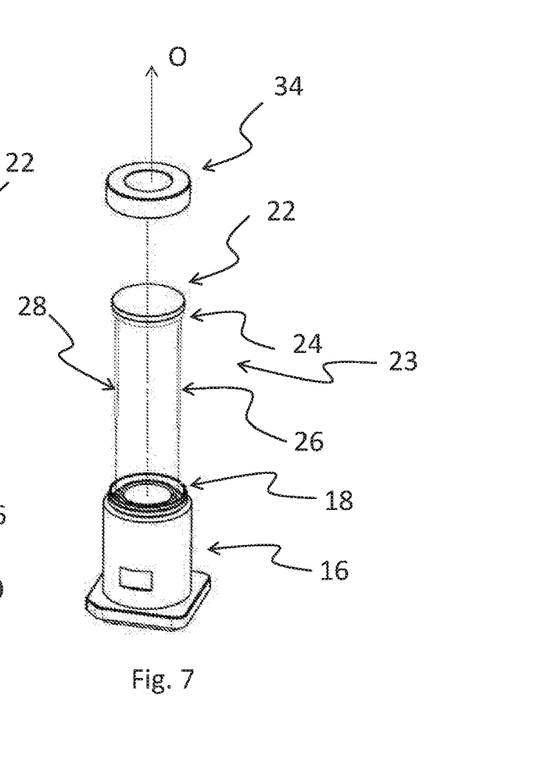
FIG. 7 is a schematic view of an assembly method of the optical device according to an example embodiment of the present disclosure with the preassembly of the top optical element with the heating element according to FIG. 6.

According to the example of FIG. 6 a preassembly of the top optical element 22 together with the heating part 24 of the heating element 23 is proceeded being arranged on the top extremity 18 of the lens holder 16 as shown in FIG. 7. Such preassembly step may be realized, as a non-limited example, by a gluing process between the heating part 24 of the heating element 23 and the top optical element 22, or by a mechanical attachment between the heating part 24 of the heating element 23 and the top optical element 22.

We claim:

1. An optical device comprising:
   a printed circuit board comprising an image capture electronic circuit;
   a lens holder extending along an optical axis of the optical device from a top extremity to a bottom extremity of the lens holder, said lens holder comprising a top optical element arranged on the top extremity of the lens holder, the lens holder being mounted on the printed circuit board so as to align, along the optical axis of the optical device, the image capture electronic circuit and the top optical element;
   a heating element comprising a heating part arranged in contact with the top optical element and comprising a first electrical conductive wire and a second electrical conductive wire, each electrical conductive wire extending from the heating part to a bottom extremity of the electrical conductive wire, the bottom extremity of each electrical conductive wire having an electrically conductive rigid end that is directly attached in electrical contact with the printed circuit board;
   a first wire insertion guide element, the first electrical conductive wire being arranged in the first wire insertion guide element; and
   a second wire insertion guide element, the second electrical conductive wire being arranged in the second wire insertion guide element;
   wherein:
   the first and second wire insertion guide elements each include an open cavity contained within and extending through a cylindrical wall of the lens holder from an open top extremity of the cylindrical wall to an open bottom extremity of the cylindrical wall;
   the printed circuit board comprises two pass-through holes from a top layer to a bottom layer of the printed circuit board; and
   the electrically conductive rigid end of each electrical conductive wire passes through one of the two pass-through holes and is welded onto the bottom layer of the printed circuit board.

2. The optical device according to claim 1, wherein each open bottom extremity of each open cavity bears against the printed circuit board and directly facing one pass through holes of the printed circuit board.

3. A method of assembling an optical device including a lens holder, a printed circuit board supporting an image capture electronic circuit, and a heating element in contact with an optical element, the method comprising:
   fixing a first end of the lens holder onto the printed circuit board using an adhesive, the printed circuit board having first and second pass-through holes extending from a top layer to a bottom layer of the printed circuit board;
   arranging the heating element on a second, opposite end of the lens holder;
   arranging the optical element on the second end of the lens holder and in contact with a heating part of the heating element;
   inserting a first electrically conductive wire of the heating element into a first wire insertion guide element;
   inserting a second electrically conductive wire of the heating element into a second wire insertion guide element, the first and second electrically conductive wires each having an electrically conductive rigid end;
   aligning the image capture electronic circuit with an optical axis of the optical element before the adhesive cures;
   inserting the electrically conductive rigid end of the first electrically conductive wire through the first pass-through hole of the printed circuit board;
   inserting the electrically conductive rigid end of the second electrically conductive wire through the second pass-through hole of the printed circuit board; and
   welding the electrically conductive rigid end of each electrically conductive wire onto the bottom layer of the printed circuit board before the adhesive cures;
   wherein the first and second wire insertion guide elements each include an open cavity contained within and extending through a cylindrical wall of the lens holder from an open top extremity of the cylindrical wall to an open bottom extremity of the cylindrical wall.

4. The method according to claim 3, comprising preassembling the optical element together with the heating part of the heating element before arranging the optical element on the first end of the lens holder.

* * * * *

UNITED STATES PATENT AND TRADEMARK OFFICE
CERTIFICATE OF CORRECTION

PATENT NO. : 11,892,702 B2
APPLICATION NO. : 16/857360
DATED : February 6, 2024
INVENTOR(S) : Arkadiusz Rafalowski et al.

Page 1 of 1

It is certified that error appears in the above-identified patent and that said Letters Patent is hereby corrected as shown below:

In the Claims

At Column 6, Claim 2, Line 27, delete "facing one" and insert --faces one of the two--

At Column 6, Claim 3, Line 38, delete "the" and insert --a--

At Column 6, Claim 3, Line 40, delete "the optical" and insert --an optical--

Signed and Sealed this
Twenty-fifth Day of March, 2025

Coke Morgan Stewart
*Acting Director of the United States Patent and Trademark Office*